United States Patent [19]

Li et al.

[11] Patent Number: 6,093,602
[45] Date of Patent: Jul. 25, 2000

[54] METHOD TO FORM POLYCIDE LOCAL INTERCONNECTS BETWEEN NARROWLY-SPACED FEATURES WHILE ELIMINATING STRINGERS

[75] Inventors: Weining Li; Lin Yung Tao; Ramachandramurthy Pradeep Yelehanka; Tin Tin Wee, all of Singapore, Singapore

[73] Assignee: Chartered Semiconductor Manufacturing Company, Singapore, Singapore

[21] Appl. No.: 09/356,007

[22] Filed: Jul. 16, 1999

[51] Int. Cl.[7] ................................................ H01L 21/8242
[52] U.S. Cl. ........................... 438/256; 438/592; 438/597
[58] Field of Search .................................... 438/592, 583, 438/738, 618, 791; 257/756, 758, 774

[56] References Cited

U.S. PATENT DOCUMENTS

| | | | |
|---|---|---|---|
| 5,340,774 | 8/1994 | Yen | 437/240 |
| 5,573,980 | 11/1996 | Yoo | 437/200 |
| 5,661,085 | 8/1997 | Teong | 438/653 |
| 5,723,374 | 3/1998 | Haang et al. | 438/253 |
| 5,866,449 | 2/1999 | Liaw et al. | 438/238 |
| 5,935,873 | 8/1999 | Spuler et al. | 438/710 |
| 5,945,738 | 8/1999 | Nguyen et al. | 257/756 |
| 5,989,987 | 11/1999 | Kuo | 438/592 |

*Primary Examiner*—Matthew Smith
*Assistant Examiner*—Calvin Lee
*Attorney, Agent, or Firm*—George O. Saile; Rosemary L.S. Pike

[57] ABSTRACT

A method of fabricating local interconnects of polycide has been achieved. A substrate is provided. Narrowly spaced features, such as MOS transistor gates and polysilicon traces, are provided overlying the substrate. A dielectric layer is deposited overlying the substrate and the narrowly spaced features. The dielectric layer is patterned to form openings between the narrowly spaced features for planned contacts to the surface of the substrate. A doped polysilicon layer is deposited overlying the dielectric layer and filling the openings. The doped polysilicon layer is etched down to the top surface of the narrowly spaced features. The doped polysilicon layer remains in the spaces between the narrowly spaced features. A polycide layer is formed overlying the narrowly spaced features and the doped polysilicon layer. The polycide layer and the doped polysilicon layer are patterned to complete the contacts and create the local interconnects of polycide, and the integrated circuit device is completed.

20 Claims, 4 Drawing Sheets

METHOD TO FORM POLYCIDE LOCAL INTERCONNECTS BETWEEN NARROWLY-SPACED FEATURES WHILE ELIMINATING STRINGERS

BACKGROUND OF THE INVENTION (1) Field of the Invention

The invention relates to a method of fabricating silicon structures, and more particularly, to the formation of local interconnects of polycide between narrowly spaced features in the manufacture of integrated circuit devices.

(2) Description of the Prior Art

In the art, polycide stacks, for example, tungsten silicide overlying polysilicon, are often used for constructing local interconnects between nodes in SRAM memory cells. Polycide provides a low resistivity conductive material with good mechanical and chemical resistance properties. By using polycide to form local interconnects, it is possible to provide the necessary connectivity for a memory cell while not using additional, and expensive, metal interconnect processes. As an example, the polycide interconnect can be used for the common $V_{ss}$ connections between metal-oxide-semiconductor (MOS) transistors in a four transistor SRAM cell via self-aligned contacts (SAC). In such application, it is necessary that the polycide layer exhibit a low sheet resistance. Therefore, the tungsten silicide component of the polycide layer must be formed sufficiently thick to achieve a low sheet resistance for the total film.

Referring to FIG. 1, a cross-section of a partially completed prior art SRAM memory cell in an integrated circuit is shown. Four transistor gates 14 are shown formed overlying a substrate 10. Each gate 14 is composed of a gate dielectric 18, a polysilicon electrode 22, an encapsulating dielectric 26, and sidewall spacers 30. Source and drain regions 32 are formed in the substrate 10. The transistors shown are conventional and very common in the art. The transistors are for m ed as narrowly spaced pairs. An interpoly layer 34, or IPL, overlies the transistors and substrate 10. The interpoly layer 34 is a dielectric material.

Referring now to FIG. 2, the interpoly layer 34 has been patterned. The opening in the interpoly layer 34 is for a contact to the source or drain region 32 between the narrowly spaced transistor gates 14. Note that the opening in the interpoly layer 34 is larger than the contact area at the surface of the substrate 10. Such a contact opening is called a self-aligned contact (SAC).

Referring now to FIG. 3, a polysilicon layer 38 and a metal silicide layer 42 are deposited overlying the interpoly layer 34 and the substrate 10 in the source or drain region 32. The metal silicide layer 42 is composed, for example, of tungsten silicide ($WSi_x$). The combination of the polysilicon layer 38 and the metal silicide layer 42 forms a polycide layer.

Referring now to FIG. 4, the metal silicide layer 42 and the polysilicon layer 38 are patterned to form local interconnects out of polycide. In the etch process, the metal silicide layer 42 and the polysilicon layer 38 are removed where not protected by a mask that is not shown. It is crucial that all of the exposed polycide be removed during the etching step. Unfortunately, polycide is not easy to etch. In constricted areas, such as between the narrowly spaced gates 14, the polycide may not etch completely away. Polycide stringers 46 may remain following this etch. These polycide stringers 46 create potential shorting conditions for the circuit and are unacceptable.

This problem could be eliminated by depositing and planarizing a very thick interpoly layer. Unfortunately, this will create other problems in the etching process. overetching of the encapsulating layer or the sidewall spacers could occur due to the greater depth of the interpoly layer that would have to be etched through. Gate shorts to the local interconnect polycide would result.

Several prior art approaches disclose methods to form contacts and to utilize metal silicide in the fabrication of integrated circuits. U.S. Pat. No. 5,573,980 to Yoo discloses a process to selectively form silicide plates over source contacts in an SRAM process. A polysilicon layer is deposited overlying the SRAM polysilicon gates, sources, and drains. The polysilicon layer is removed except over the source or drain regions where silicide is planned. Titanium is deposited and heat-treated to form silicide. The excess titanium is then removed. U.S. Pat. No. 5,723,374 to Huang et al teaches a process to form stacked capacitor DRAM devices. Silicon nitride sidewall spacers are formed over the interpoly oxide to make it easier to remove the polysilicon bottom plate layer during the etch. U.S. Pat. No. 5,866,449 to Liaw et al discloses a process to fabricate a SRAM device. U.S. Pat. No. 5,661,085 to Teong teaches a process to form silicide contacts to source and drain regions. U.S. Pat. No. 5,340,774 to Yen teaches a process to form transistor contacts using local planarization. A fill layer of an insulator material is deposited and blanket etched to from planarizing fills between polysilicon lines. The fills are then etched away where contacts are desired.

SUMMARY OF THE INVENTION

A principal object of the present invention is to provide an effective and very manufacturable method of forming local polycide interconnects between narrowly spaced features in the manufacture of integrated circuits.

A further object of the present invention is to provide a method to fabricate local interconnects of polycide between narrowly spaced features in which polycide stringers are eliminated.

A yet further object of the present invention is to eliminate polycide stringers by depositing a thick polysilicon layer that will both fill the narrow spaces between features and be easily etched away.

Another further object of the present invention is to provide a method to fabricate local polycide interconnects between narrowly spaced MOS gates in which polycide stringers are eliminated.

In accordance with the objects of this invention, a new method of fabricating local interconnects of polycide has been achieved. A substrate is provided. Narrowly spaced features, such as MOS transistor gates and polysilicon traces, are provided overlying the substrate. A dielectric layer is deposited overlying the substrate and the narrowly spaced features. The dielectric layer is patterned to form openings between the narrowly spaced features for planned contacts to the surface of the substrate. A doped polysilicon layer is deposited overlying the dielectric layer and filling the openings. The doped polysilicon layer is etched down to the top surface of the narrowly spaced features. The doped polysilicon layer remains in the spaces between the narrowly spaced features. A polycide layer is formed overlying the narrowly spaced features and the doped polysilicon layer. The polycide layer and the doped polysilicon layer are patterned to complete the contacts and create the local interconnects of polycide, and the integrated circuit device is completed.

BRIEF DESCRIPTION OF THE DRAWINGS

In the accompanying drawings forming a material part of this description, there is shown.

DESCRIPTION OF THE PREFERRED EMBODIMENTS

Figure 1:
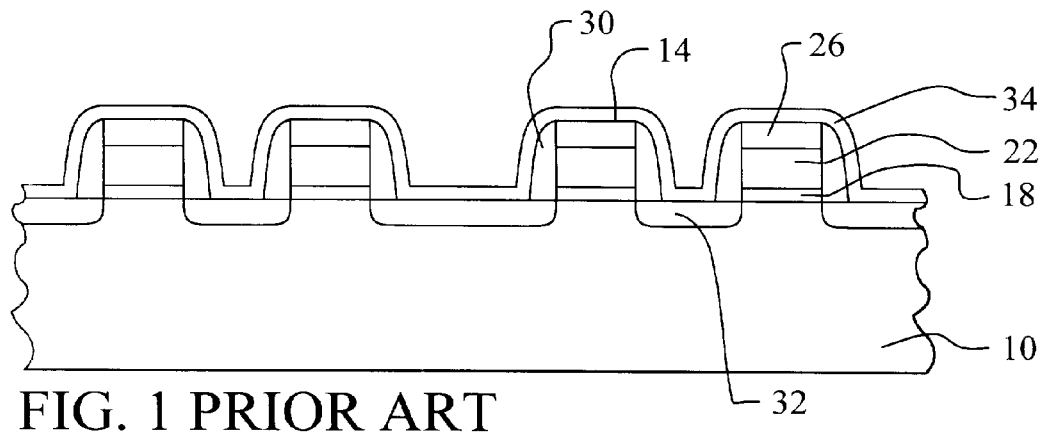
FIGS. 1 through 4 schematically illustrate in cross-section a partially completed prior art integrated circuit device where local interconnects are formed using polycide.
Figure 2:
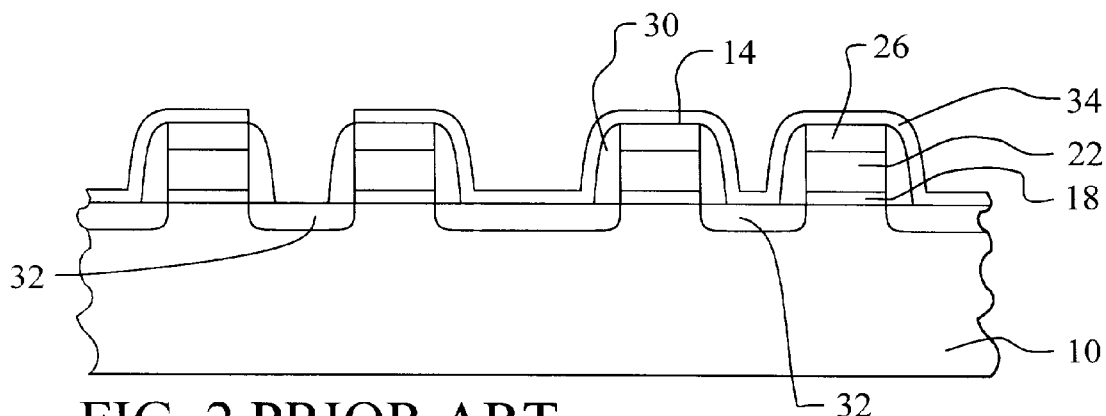
Figure 3:
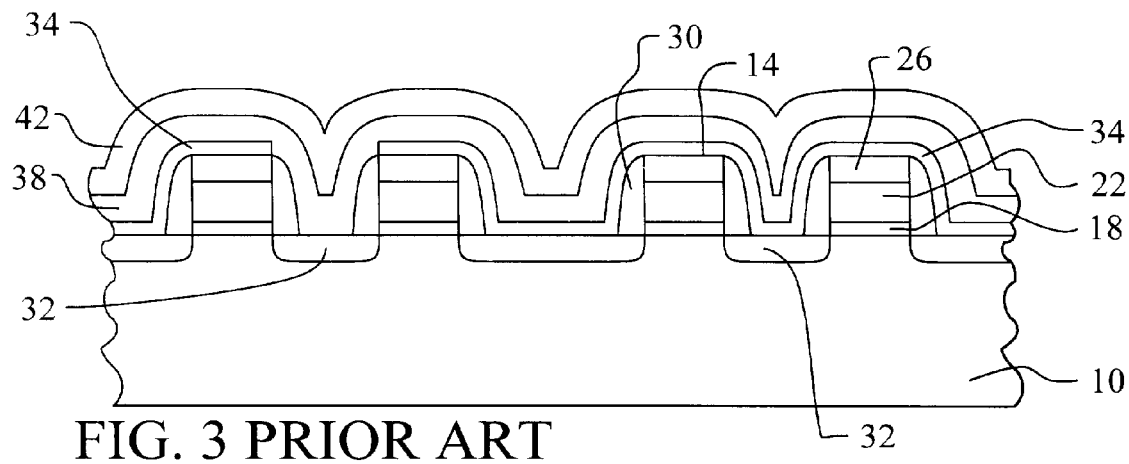
Figure 4:
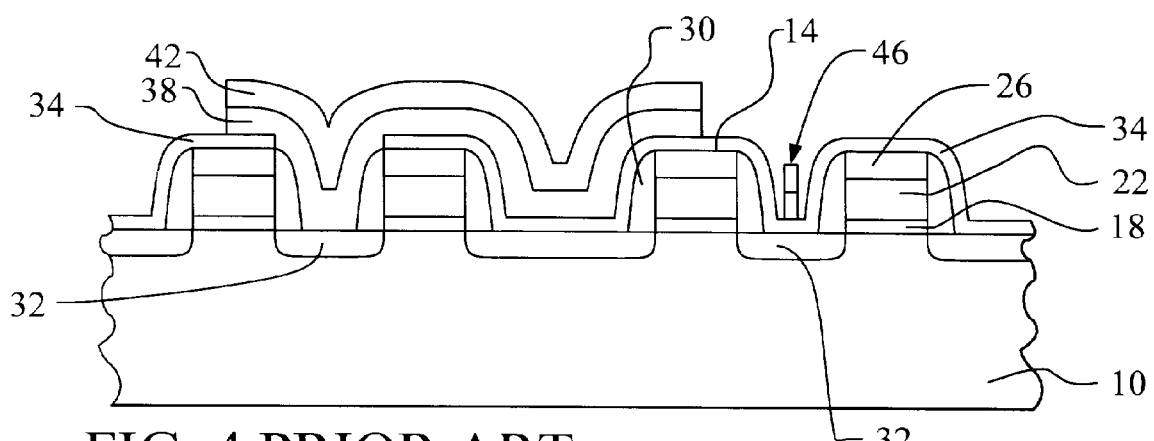
Figure 5:
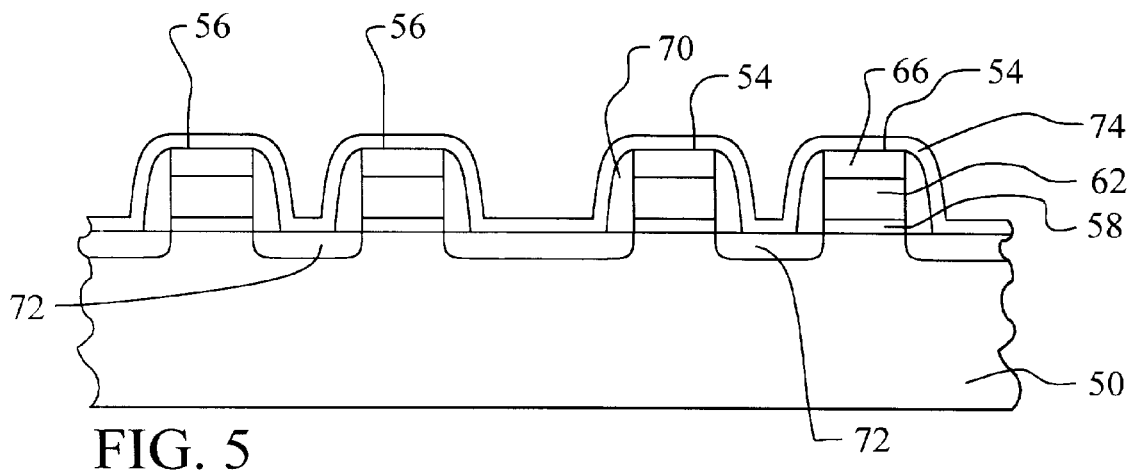
FIGS. 5 through 11 schematically illustrate in cross-sectional representation a preferred embodiment of the present invention.

Referring now more particularly to FIG. 5, there is illustrated a cross section of a partially completed integrated circuit device. This embodiment displays a four-transistor circuit like that used to create a SRAM memory cell. It should be clear to those experienced in the art that the present invention can be applied to many scenarios where it is desirable to make contacts between narrowly spaced features overlying the substrate.

The substrate 50 is preferably composed of monocrystalline silicon. Several narrowly spaced transistor gates 54 and 56 are shown formed overlying the substrate 50. These transistor gates 54 and 56 are formed using conventional methods that are well known in the art. Each of the transistor gates 54 and 56 is composed of, for example, a gate dielectric 58, a polysilicon electrode 62, an encapsulating dielectric 66, and sidewall spacers 70. Source and drain regions 72 are formed by conventional methods in the substrate 50. The spaces between the transistor gates 54 and 56 are between about 0.20 and 0.50 microns.

A dielectric layer 74 is deposited overlying the substrate 70 and the transistor gates 54 and 56. The dielectric layer 74 is preferably comprised of silicon dioxide or silicon nitride. The purpose of the dielectric layer 74 is to isolate the substrate from the subsequent polysilicon and polycide layers. It is advantageous, though not necessarily essential to the present invention, to chose one material for the dielectric layer 74 and a different material for the sidewall spacers 70 and encapsulation dielectric 66. For example, if silicon nitride is used for both the sidewall spacers 70 and encapsulation dielectric 66, then the selection of silicon dioxide for the dielectric layer 74 can provide an advantageous etching selectivity to protect the transistor gates 54 and 56 from etching damage. The dielectric layer 74 is preferably grown to a thickness of between about 500 Angstroms and 2,000 Angstroms.

Figure 6:
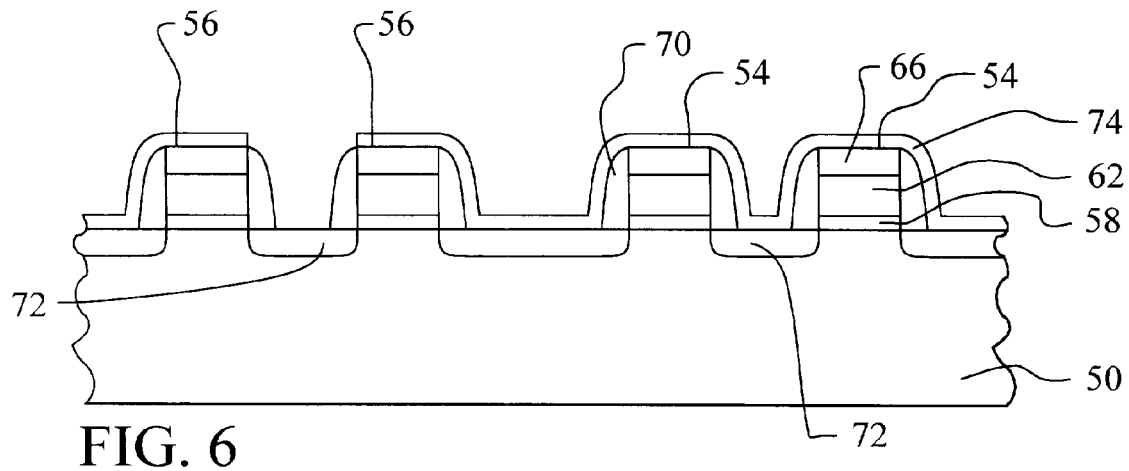

Referring now to FIG. 6, the dielectric layer 74 is patterned to form openings between the narrowly spaced transistor gates 56 for planned contacts to the surface of the substrate 50. This etching occurs where the dielectric layer 74 is not protected by a mask that is not shown. The etching step is performed using a conventional reactive ion etch (RIE).

Note that, as in the prior art example, the opening in the dielectric layer 74 is larger than the contact area at the surface of the substrate 50. This self-aligned contact (SAC) etch takes advantage of the use of one material for the dielectric layer 74 and a different material for the sidewall spacers 70 and encapsulation dielectric 66.

An optional process may be performed at this point of the sequence. Ions implantation can be implanted into the exposed substrate 50 in the exposed source and drain regions 72. This implant will reduce the self-aligned contact resistance. In the preferred embodiment using this optional step, phosphorous ions would be implanted at a dose of between about $1.0 \times 10^{15}$ atoms/cm$^2$ and $5.0 \times 10^{15}$ atoms/cm$^2$ and an energy of between about 10 KeV and 30 KeV.

Figure 7:
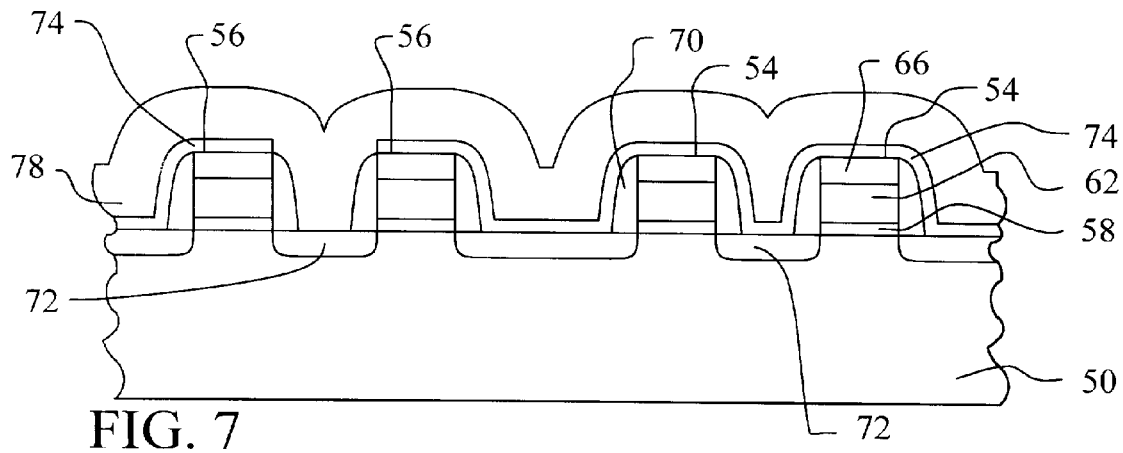

Referring now to FIG. 7, an important feature of the present invention is disclosed. A first doped polysilicon layer 78 is deposited overlying the dielectric layer 74 and filling the openings. This first doped polysilicon layer 78 also fills the spaces between narrowly spaced transistor gates 54 and 56. The first doped polysilicon layer 78 performs two functions in the present invention. First, where contact openings have been etched (between gates 56), the first doped polysilicon layer 78 forms contact plugs to the surface of the substrate 50. Second, where contact openings have not been etched (between gates 54), the first doped polysilicon layer 78 forms a temporary fill layer that can easily be etched away during the patterning of polycide.

The two functions of the first doped polysilicon layer 78 also require that this layer be relatively thick and heavily doped. The first doped polysilicon layer 78 may be deposited either doped, using insitu doping, or undoped, and then ion implanted. In the preferred embodiment, the first doped polysilicon layer 78 is deposited using an insitu doping process in a low-pressure chemical vapor deposition (LPCVD) chamber. The first doped polysilicon layer 78 is deposited to a thickness of between about 2,000 Angstroms and 5,000 Angstroms. The first doped polysilicon layer has an ion concentration of between about $3.0 \times 10^{19}$ atoms/cm$^3$ and $1.0 \times 10^{21}$ atoms/cm$^3$.

Figure 8:
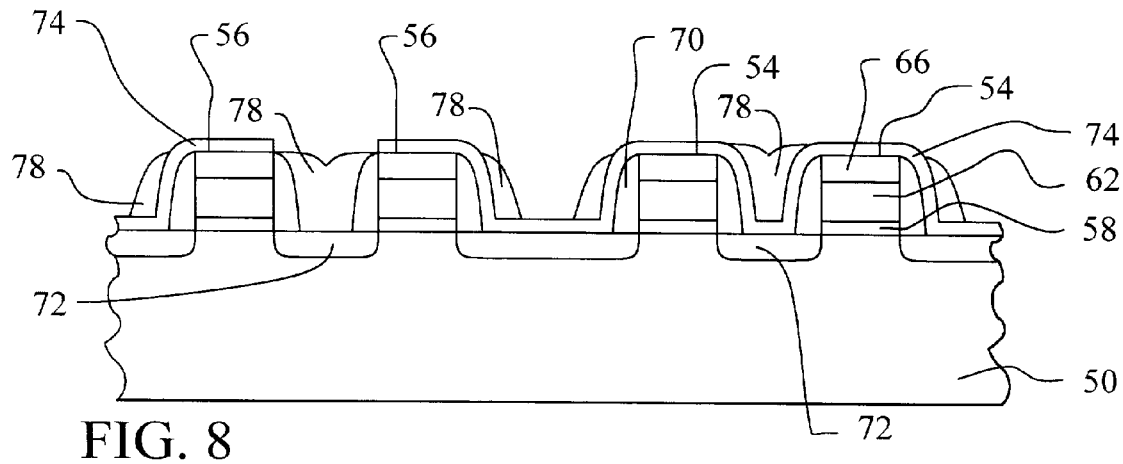

Referring now to FIG. 8, another important step in the present invention is shown. The first doped polysilicon layer 78 is etched down to the top surface of the narrowly spaced transistor gates 54 and 56. The first doped polysilicon layer 78 remains in the spaces between the narrowly spaced transistor gates 54 and 56. A blanket etch-back process is used to etch down the first doped polysilicon layer 78. The blanket etch-back process is comprised of a reactive ion etch (RIE) process using an etching chemistry of $Cl_2$ and HBr.

The etch-back process is optimized such that the first doped polysilicon layer 78 remains between the narrowly spaced transistor gates 54 and 56. The two previously discussed outcomes of the etching down of the first doped polysilicon layer 78 are shown on FIG. 8. First, where a contact opening was previously etched through the dielectric layer 74 between narrowly spaced transistor gates 56, a contact plug is formed. Second, where no contact opening was formed between narrowly spaced transistor gates 54, a temporary fill layer is formed.

Figure 9:
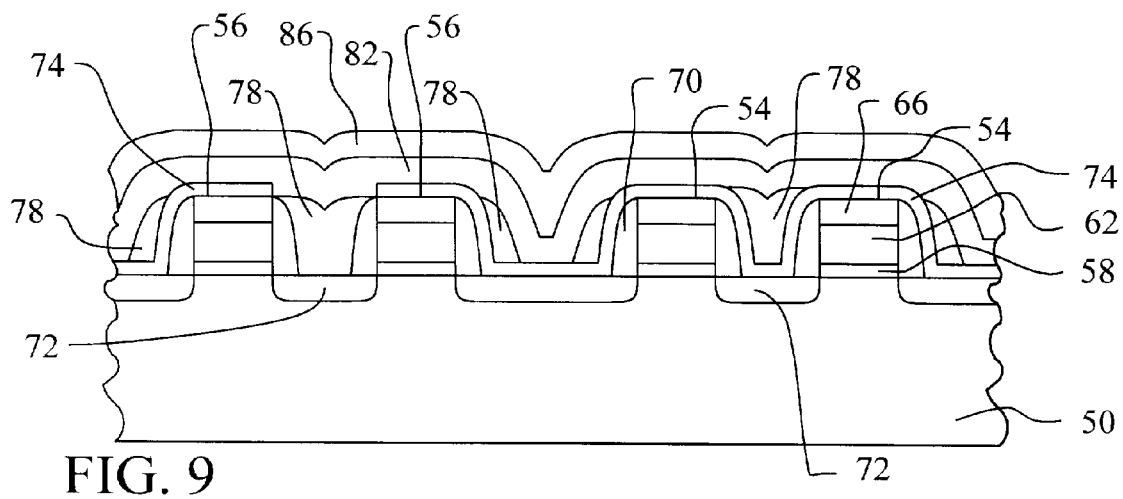

Referring now to FIG. 9, polycide will be formed overlying the narrowly spaced transistor gates 54 and 56 and the first doped polysilicon layer 78. The polycide is composed of a second doped polysilicon layer 82 and a metal silicide layer 86. The second doped polysilicon layer 82 is deposited overlying the narrowly spaced transistor gates 54 and 56 and the first doped polysilicon layer 78. The second doped polysilicon layer 82 is preferably deposited using an insitu doping process in an LPCVD chamber to a thickness of between about 500 Angstroms and 1,000 Angstroms.

The metal silicide layer 86 is preferably comprised of tungsten silicide ($WSi_x$) deposited by chemical vapor deposition (CVD). The metal silicide layer 86 is deposited to a thickness of between about 500 Angstroms and 1,000 Angstroms.

Figure 10:
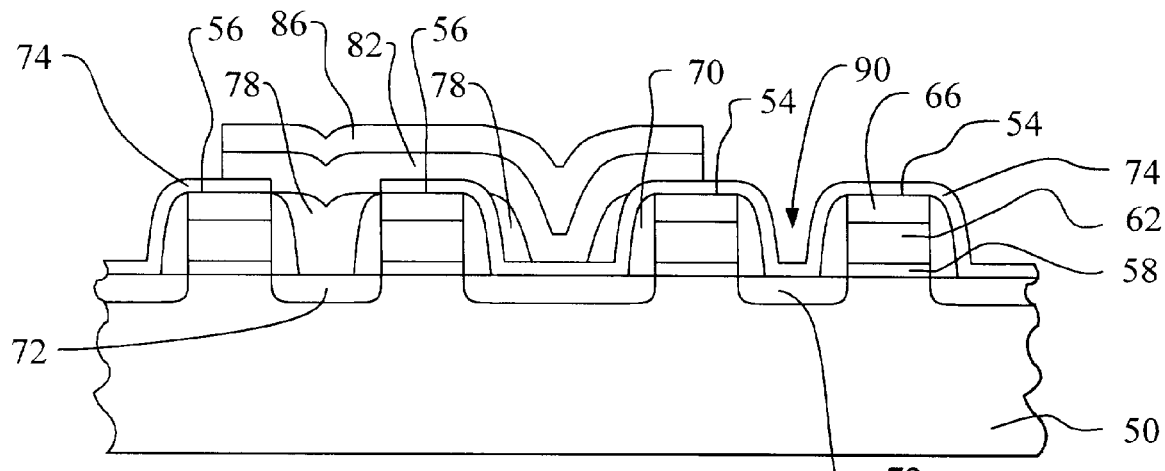
Figure 11:
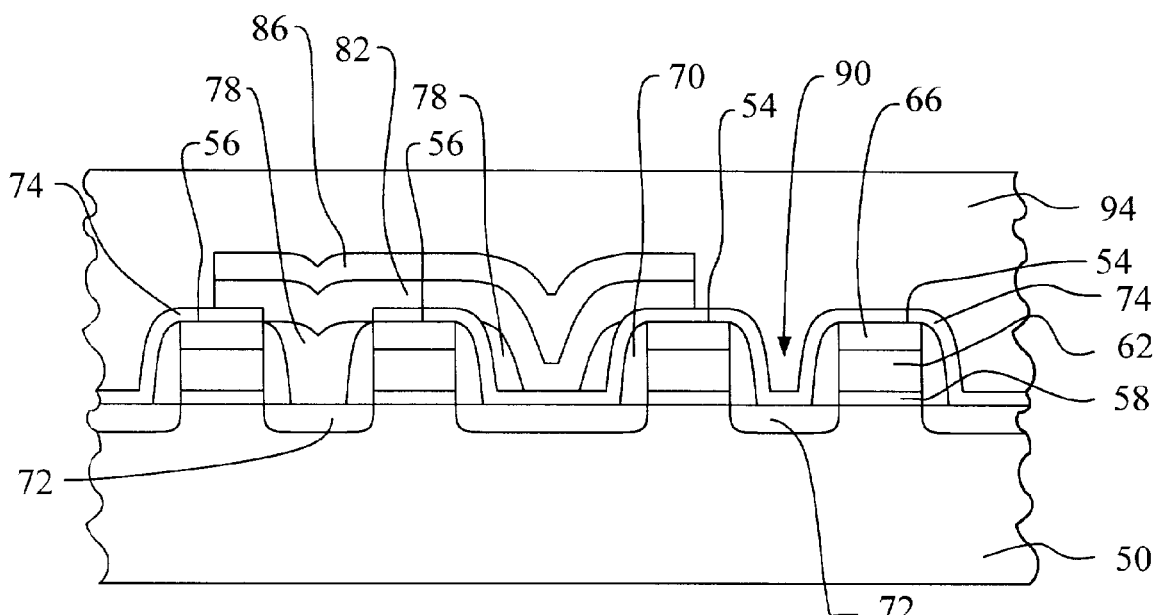

Referring now to FIG. 10, the metal silicide layer 86, second doped polysilicon layer 82, and the first doped polysilicon layer 78 are patterned to complete the contacts and create the local interconnects. This etching occurs where the metal silicide layer 86 is not protected by a mask that is not shown. The etching step is performed using a reactive ion etching (RIE) process using an etching chemistry comprising $Cl_2$ and HBr. Etching is stopped at the dielectric layer 74 that protects the substrate 50. Processing continues with the deposition, for example, of a plasma nitride layer 94 to complete the integrated circuit device as shown in FIG. 11.

It can now be seen how the present invention improves the art. The novel temporary fill layer, comprised of the first doped polysilicon layer 78, was formed between the narrowly-spaced transistor gates 54 where no contact opening is planned. The etch of the metal silicide layer 86, second doped polysilicon layer 82, and the first doped polysilicon layer 78 completely removes this temporary fill layer leaving no polycide stringers as shown by 90. The key to the present invention is that doped polysilicon can be more easily removed from a constricted space than polycide. By eliminating polycide stringers, yield will be improved.

As shown in the preferred embodiment, the present invention provides a very manufacturable process for fabricating local interconnects of polycide between narrowly spaced MOS gates in which polycide stringers are eliminated in the manufacture of integrated circuit devices.

While the invention has been particularly shown and described with reference to the preferred embodiments thereof, it will be understood by those skilled in the art that various changes in form and details may be made without departing from the spirit and scope of the invention.

What is claimed is:

1. A method of forming contacts between narrowly spaced features in the manufacture of an integrated circuit device comprising:

providing features overlying and projecting above a substrate wherein said features are narrowly spaced;

depositing a dielectric layer overlying said features and said substrate;

patterning said dielectric layer to form openings for planned contacts wherein said openings are formed between some of said features but not formed between other of said features;

depositing a first doped polysilicon layer overlying said dielectric layer and filling spaces between said features;

etching down said first doped polysilicon layer to the top surface of said features wherein said first doped polysilicon layer remains in and fills said spaces between said features;

forming a polycide layer overlying said dielectric layer and said first doped polysilicon layer;

patterning said polycide layer and said first doped polysilicon layer to complete said contacts between said features whereby said polycide layer and said first doped polysilicon layer are completely removed between said features where contacts are not to be made; and completing the fabrication of the integrated circuit device.

2. The method according to claim 1 wherein said features comprise one of the group of: metal oxide semiconductor gates and polysilicon gates.

3. The method according to claim 1 wherein said spaces between features are between about 0.20 microns and 0.50 microns.

4. The method according to claim 1 wherein said features have an overlying silicon nitride encapsulating layer and adjacent silicon nitride sidewall spacers.

5. The method according to claim 1 wherein said dielectric layer is comprised of one of the group of: silicon dioxide and silicon nitride.

6. The method according to claim 1 wherein said first doped polysilicon layer is deposited using insitu doping with an ion concentration of between about $3.0 \times 10^{19}$ atoms/cm$^3$ and $1.0 \times 10^{21}$ atoms/cm$^3$.

7. The method according to claim 1 wherein said first doped polysilicon layer is deposited undoped and is then ion implanted to an ion concentration of between about $3.0 \times 10^{19}$ atoms/cm$^3$ and $1.0 \times 10^{21}$ atoms/cm$^3$.

8. The method according to claim 1 wherein said first doped polysilicon layer is deposited to a thickness of between about 2,000 Angstroms and 5,000 Angstroms.

9. The method according to claim 1 wherein said step of forming a polycide layer comprises:

depositing a second doped polysilicon layer; and depositing a metal silicide layer overlying said second doped polysilicon layer.

10. The method according to claim 1 further comprising implanting ions into said substrate after said step of patterning said dielectric layer to form openings for planned contacts and before said step of depositing said first doped polysilicon layer wherein said implanted ions reduce contact resistance.

11. A method of forming local interconnects between MOS transistors in the manufacture of an integrated circuit device comprising:

providing MOS transistors overlying and projecting above a substrate wherein said MOS transistors are narrowly spaced and comprise transistor gates, drains, and sources;

depositing a dielectric layer overlying said transistor gates and said substrate;

patterning said dielectric layer to form openings for planned contacts wherein said openings are formed between some of said transistor gates but not formed between other of said transistor gates and wherein said openings extend to the top surface of said substrate;

depositing a first doped polysilicon layer overlying said dielectric layer and filling spaces between said transistor gates;

etching down said first doped polysilicon layer to the top surface of said transistor gates wherein said first doped polysilicon layer remains in and fills said spaces between said transistor gates;

forming a polycide layer overlying said dielectric layer and said first doped polysilicon layer;

patterning said polycide layer and said first doped polysilicon layer to complete said contacts between said transistor gates whereby said polycide layer and said first doped polysilicon layer are completely removed between said transistor gates where contacts are not to be made; and completing the fabrication of the integrated circuit device.

12. The method according to claim 11 wherein said step of forming a polycide layer comprises:

depositing a second doped polysilicon layer; and depositing a tungsten silicide layer overlying said second doped polysilicon layer.

13. The method according to claim 11 wherein said first doped polysilicon layer is deposited using insitu doping with an ion concentration of between about $3.0 \times 10^{19}$ atoms/cm$^3$ and $1.0 \times 10^{21}$ atoms/cm$^3$.

14. The method according to claim 11 wherein said first doped polysilicon layer is deposited undoped and is then ion implanted to an ion concentration of between about $3.0 \times 10^{19}$ atoms/cm$^3$ and $1.0 \times 10^{21}$ atoms/cm$^3$.

15. The method according to claim 11 wherein said first doped polysilicon layer is deposited to a thickness of between about 2,000 Angstroms and 5,000 Angstroms.

16. The method according to claim 11 further comprising implanting ions into said substrate after said step of patterning said dielectric layer to form openings for planned contacts and before said step of depositing said first doped polysilicon layer wherein said implanted ions reduce contact resistance.

17. A method of forming local interconnects between MOS transistors in the manufacture of an integrated circuit device comprising:

providing MOS transistors overlying and projecting above said substrate wherein said MOS transistors are narrowly spaced and comprise transistor gates, drains, and sources and wherein said MOS transistor gates have an overlying silicon nitride encapsulating layer and adjacent silicon nitride sidewall spacers;

depositing a dielectric layer overlying said transistor gates and said substrate;

patterning said dielectric layer to form openings for planned contacts wherein said openings are formed between some of said transistor gates but not formed between other of said transistors gates and wherein said openings extend to top surface of said substrate;

depositing a first doped polysilicon layer overlying said dielectric layer and filling spaces between said transistor gates;

etching down said first doped polysilicon layer to the top surface of said transistor gates wherein said first doped polysilicon layer remains in and fills said spaces between said transistor gates;

forming a polycide layer overlying said dielectric layer and said first doped polysilicon layer wherein said polycide layer comprises a second doped polysilicon layer overlying said first doped polysilicon layer and a tungsten silicide layer overlying said second doped polysilicon layer;

patterning said polycide layer and said first doped polysilicon layer to complete said contacts between said transistor gates whereby said polycide layer and said first doped polysilicon layer are completely removed between said transistor gates where contacts are not to be made; and completing the fabrication of the integrated circuit device.

18. The method according to claim 17 wherein said first doped polysilicon layer is deposited to a thickness of between about 2,000 Angstroms and 5,000 Angstroms.

19. The method according to claim 17 further comprising implanting ions into said substrate after said step of patterning said dielectric layer to form openings for planned contacts and before said step of depositing said first doped polysilicon layer wherein said implanted ions reduce contact resistance.

20. The method according to claim 17 wherein said first doped polysilicon layer is deposited using insitu doping with an ion concentration of between about $3.0 \times 10^{19}$ atoms/cm$^3$ and $0.1 \times 10^{21}$ atoms/cm$^3$.

* * * * *